United States Patent
Chen et al.

(10) Patent No.: US 9,239,898 B1
(45) Date of Patent: Jan. 19, 2016

(54) CIRCUIT SIMULATION WITH RULE CHECK FOR DEVICE

(71) Applicant: TAIWAN SEMICONDUCTOR MANUFACTURING COMPANY LTD., Hsinchu (TW)

(72) Inventors: Hsien-Ming Chen, Hsinchu (TW); Yi-Ting Wang, Hsinchu County (TW); Jian-Zhi Huang, Hsinchu (TW); Chia-Ying Lin, Tainan (TW); Chia-Chi Ho, Hsinchu County (TW); Ya-Chin Liang, Tainan (TW); Ke-Wei Su, Hsinchu County (TW); Chung-Shi Chiang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/330,644

(22) Filed: Jul. 14, 2014

(51) Int. Cl.
*G06F 17/50* (2006.01)

(52) U.S. Cl.
CPC ........ *G06F 17/5045* (2013.01); *G06F 17/5022* (2013.01)

(58) Field of Classification Search
CPC .................. G06F 17/5045; G06F 17/5022
See application file for complete search history.

(56) References Cited

U.S. PATENT DOCUMENTS

| | | | | |
|---|---|---|---|---|
| 5,446,676 A * | 8/1995 | Huang et al. | ........ | G06F 17/5022 703/17 |
| 5,930,153 A * | 7/1999 | Melville et al. | ...... | G06F 17/5036 703/14 |
| 6,190,433 B1 * | 2/2001 | Van Fleet et al. | ... | G06F 17/5022 703/13 |
| 7,685,543 B2 * | 3/2010 | Tsuji et al. | .......... | G06F 17/5036 703/13 |
| 8,775,994 B2 * | 7/2014 | Weir et al. | ........... | G06F 17/5009 716/106 |
| 2003/0115558 A1 * | 6/2003 | Hilton | ................. | G06F 17/5063 716/109 |
| 2005/0086033 A1 * | 4/2005 | Chen et al. | ............. | G01R 27/28 703/2 |
| 2005/0251376 A1 * | 11/2005 | Pekker et al. | ....... | G06F 17/5036 703/14 |
| 2013/0320945 A1 * | 12/2013 | Kalnitsky | .............. | H02M 3/155 323/282 |

* cited by examiner

*Primary Examiner* — Naum B Levin
(74) *Attorney, Agent, or Firm* — WPAT, P.C.; Anthony King (57) ABSTRACT

In some embodiments, in a method, a netlist is received. The netlist comprises a subcircuit that comprises a device and a rule check module. The rule check module specifies a plurality of terminals of the device subject to an operating space, and at least one parameter that controls a non-rectangular boundary of the operating space. The netlist is simulated to obtain simulation data associated with the terminals of the device. The operating space that has the non-rectangular boundary is formed by using the at least one parameter. The simulation data is checked against the operating space. A situation in which the checked simulation data does not fall within the operating space is reflected.

20 Claims, 12 Drawing Sheets

CIRCUIT SIMULATION WITH RULE CHECK FOR DEVICE

BACKGROUND

Circuit simulators perform analyses on a circuit to obtain, for example, circuit node voltages, currents, transconductance, and other operating conditions or parameters of the circuit. For example, the SPICE (Simulation Program with Integrated Circuit Emphasis) simulator performs a Modified Nodal Analysis (MNA) on the circuit to generate a system of equations for the circuit, and solve the system of equations using transient analysis to obtain node voltages or currents at each time point in the transient analysis. In order to reduce failures or unreliability in devices in the circuit, the node voltages or currents obtained from the circuit simulation are monitored to ensure that the devices operate in their respective safe operating areas (SOAs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present.

Figure 1:
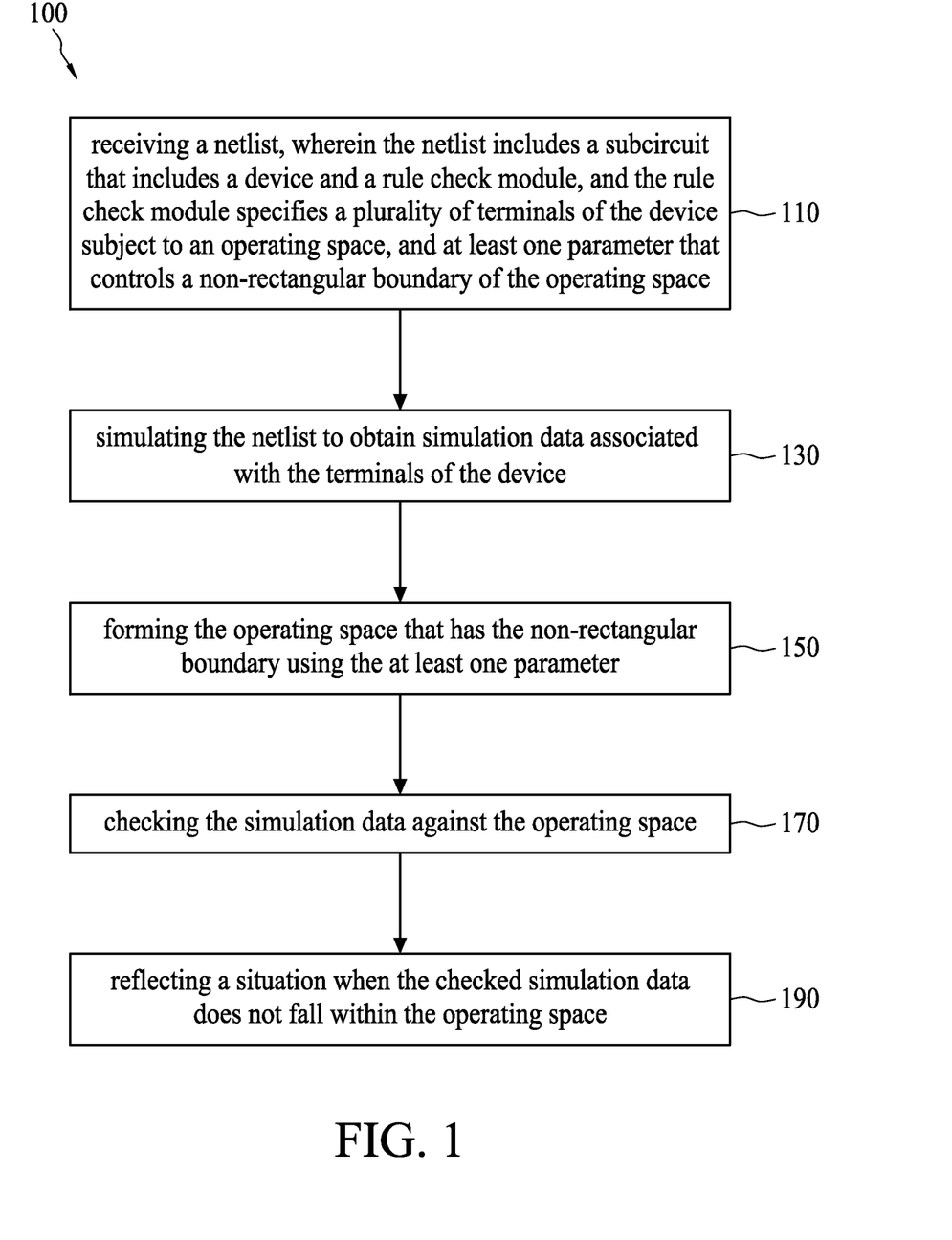
FIG. 1 is a flow diagram of a method for performing circuit simulation on a netlist that are configured with a rule check module for a device in the netlist in accordance with some embodiments.

FIG. 1 is a flow diagram of a method 100 for performing circuit simulation on a netlist that are configured with a rule check module for a device in the netlist in accordance with some embodiments. In operation 110, the netlist is received. The term "netlist" used herein refers to both a graphical representation and a textual representation of a circuit. The netlist includes a subcircuit that includes a device and a rule check module. The rule check module specifies a plurality of terminals of the device subject to an operating space, and at least one parameter that controls a non-rectangular boundary of the operating space. In operation 130, the netlist is simulated to obtain simulation data associated with the terminals of the device. In operation 150, the operating space that has the non-rectangular boundary is formed using the at least one parameter. In operation 170, the simulation data is checked against the operating space. In operation 190, a situation in which the checked simulation data does not fall within the operating space is reflected.

Figure 2:
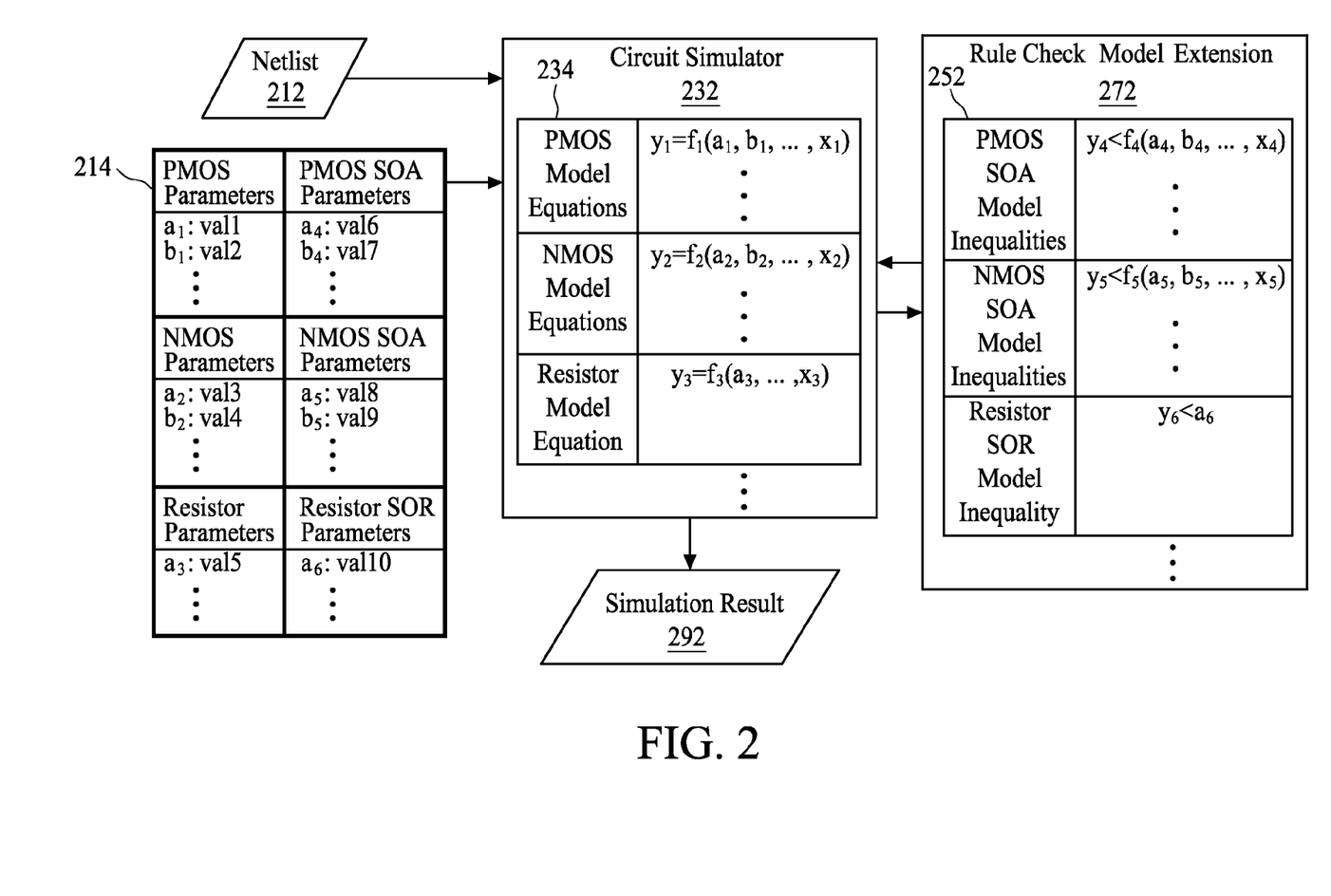
FIG. 2 is a functional block diagram of a circuit simulator that communicates with a rule check model extension to perform rule checking during circuit simulation in accordance with some embodiments.

FIG. 2 is a functional block diagram of a circuit simulator 232 that communicates with a rule check model extension 272 to perform rule checking during circuit simulation in accordance with some embodiments. The circuit simulator 232 receives a netlist 212 and a list of parameters 214. The netlist includes elements each of which is defined as a subcircuit that includes a device and a rule check module. Device models 234 for the devices are intrinsic to the circuit simulator 232. Exemplary devices include active devices such as a PMOS and an NMOS, and passive devices such as a resistor. The circuit simulator 232 includes the device models 234 each of which predicts a behavior of the respective device using, for example, one or more model equations. In some embodiments, the device models 234 are compact models such as BSIM (Berkeley Short-Channel Insulated Gate Field Effect Transistor Model) models. As an example, the PMOS device model equations are shown in FIG. 2 to include an equation $y_1 = f_1(a_1, b_1, \ldots, x_1)$, wherein $y_1$ can be a drain to source current of the PMOS, $x_1$ can be a gate to source voltage of the PMOS, and $a_1, b_1, \ldots$ are coefficients of the equation. The list of parameters 214 includes device model parameters shown in the left column of the list of parameters 214, and rule check model parameters shown in the right column of the list of parameters 214. For the coefficients $a_1, b_1, \ldots$ of the PMOS model equation $y_1 = f_1(a_1, b_1, \ldots, x_1)$, the values val1, val2, ... are provided in the list of parameters 214. As another example, the resistor device model equation is shown to include an equation $y_3 = f_3(a_3, \ldots, x_3)$, wherein $y_3$ can be a current through the resistor, $x_3$ can be a voltage across the resistor, and $a_3, \ldots$ are coefficients of the resistor device model equation. For the parameters $a_3$ of the resistor model equation $y_3 = f_3(a_3, \ldots, x_3)$, the values val5 ... are provided in the list or parameters 214. In some embodiments, the list of parameters 214 is specified using ".MODEL" statements recognized by a SPICE simulator.

The circuit simulator 232 parses the netlist 212 and at each time point in a transient analysis, the circuit simulator 232 formulates a system of equations by applying, for example, MNA. The circuit simulator 232 evaluates the model equations of the device models 234 using the device model parameters of the list of parameters 214. For example, to evaluate the model equation $y_1 = f_1(a_1, b_1, \ldots, x_1)$ of the PMOS, the values val1, val2, ... of the model parameters $a_1, b_1, \ldots$ from the list of parameters 214 are plugged into the model equation $y_1 = f_1(a_1, b_1, \ldots, x_1)$. Further, a tentative solution $x_1$ is also plugged into the model equation. The evaluated result $y_1$ is filled in the system of equations. The circuit simulator 232 solves the system of equations and checks if the newly obtained solution converges in view of the sequence of solutions obtained in previous iterations. If not, the circuit simulator 232 iteratively evaluates the model equations and solves the system of equations until the sequence of solutions reaches an acceptable solution.

During simulation, the circuit simulator 232 communicates with the rule check model extension 272 to monitor whether the solution obtained by the circuit simulator 232 renders the devices operate in a safe operating space. In some embodiments, the rule check model extension 272 includes rule check models 252 that are implemented under application programming interfaces (APIs) recognized by the circuit simulator 232. In some embodiments, the rule check model 252 is a safe operating area (SOA) that has a non-rectangular boundary within which the respective device can more safely operate. As an example, the PMOS SOA model inequalities are shown in FIG. 2 to include an inequality $y_4 < f_4(a_4, b_4, \ldots, x_4)$, wherein $y_4$ can be a gate to source voltage of the PMOS, $x_4$ can be a drain to source voltage of the PMOS, and $a_4, b_4, \ldots$ are coefficients of an equation that defines a segment of the non-rectangular boundary of the SOA. In other embodiments, the rule check model 252 is a safe operating range (SOR) within which the respective device can more safely operate. As an example, the resistor SOR model inequality includes an inequality $y_6 < a_6$, wherein $y_6$ can be the current through the resistor, and $a_6$ is the peak current that can be sustained by the resistor.

In the above embodiments, the dimension of the safe operating space is two (such as the SOA) or one (such as the SOR). The dimension of the safe operating space more than, equal to or less than two are within the contemplated scope of the present disclosure. The SOA is used as an example in the present disclosure.

The circuit simulator 232 passes the values of the rule check model parameters in the received list of parameters 214 to the rule check model extension 272 so that the rule check model extension 272 can form the SOA. For example, the circuit simulator 232 passes the values val6, val7, ... of the rule check model parameters $a_4, b_4, \ldots$ in the list of parameters 214 to the rule check model extension 272. The rule check model extension 272 then forms the equation $y_4 = f_4(a_4, b_4, \ldots, x_4)$ that defines the segment of the non-rectangular boundary of the SOA using the values val6, val7 as the coefficients $a_4, b_4, \ldots$ and establishes PMOS SOA model inequalities using the equation $y_4 = f_4(a_4, b_4, \ldots, x_4)$.

The rule check model extension 272 further plugs in $x_4$ and $y_4$ obtained using the solution from the circuit simulator 232 to the inequality to check if the solution renders the PMOS operating in the SOA. If the solution does not render the PMOS operating the SOA, the rule check model extension 272 reflects the situation by, for example, issuing a warning or an error to the circuit simulator 232. Therefore, when the circuit simulator 232 outputs the simulation result 292, the warning or error can be displayed.

Figure 3:
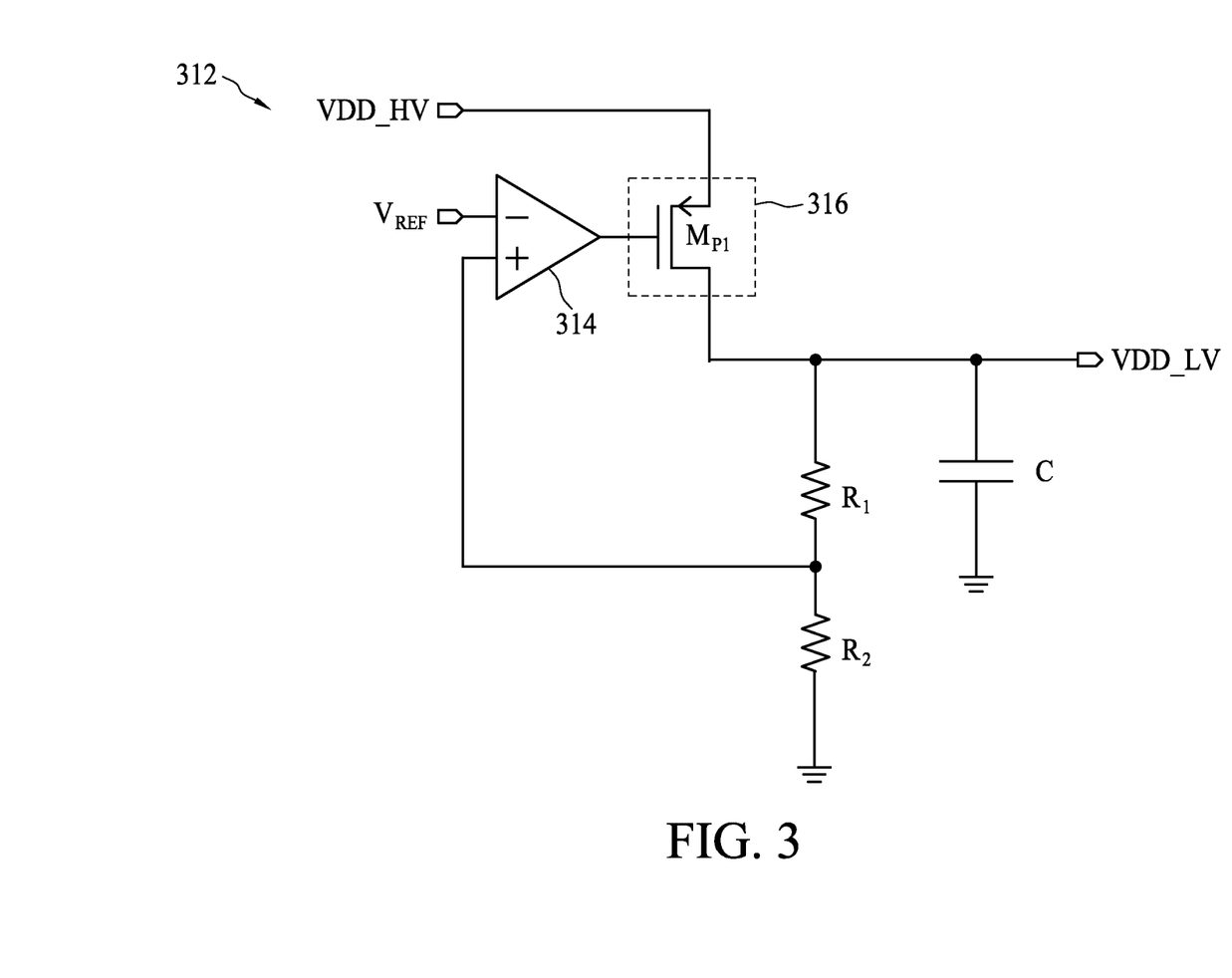
FIG. 3 is a schematic circuit diagram of a netlist of a low dropout (LDO) voltage regulator received by the circuit simulator in accordance with some embodiments.

Referring to FIGS. 1 and 2, in operation 110, the circuit simulator 232 receives the netlist 212. The netlist 212 includes the subcircuit that includes the device and the rule check module. The rule check module specifies the plurality of terminals of the device subject to the operating space, and the at least one parameter that controls the non-rectangular boundary of the operating space. FIG. 3 is a schematic circuit diagram of a netlist 312 of a low dropout (LDO) voltage regulator received by the circuit simulator 232 in accordance with some embodiments. The netlist 312 includes an error amplifier 314, a subcircuit 316 that includes a p-channel power MOSFET $M_{p1}$, resistors $R_1$ and $R_2$, and a capacitor C. The p-channel power MOSFET $M_{p1}$ has a source terminal receiving an input voltage VDD_HV, a drain terminal outputting an output voltage VDD_LV, and a gate terminal driven by the error amplifier 314. The p-channel power MOSFET $M_{p1}$ operates in the linear region to drop the input voltage VDD_HV down to the output voltage VDD_LV. A fraction of the resulting output voltage VDD_LV is sensed by the error amplifier 314 and compared to a reference voltage $V_{REF}$. The error amplifier 314 drives the gate terminal of the p-channel power MOSFET $M_{p1}$ and controls the p-channel power MOSFET $M_{p1}$ such that the output voltage VDD_LV is maintained constant. The series resistors $R_1$ and $R_2$ provide the fraction of the output voltage VDD_LV fed back to the error amplifier 314. The capacitor C further stabilizes the output voltage VDD_LV.

Figure 4:
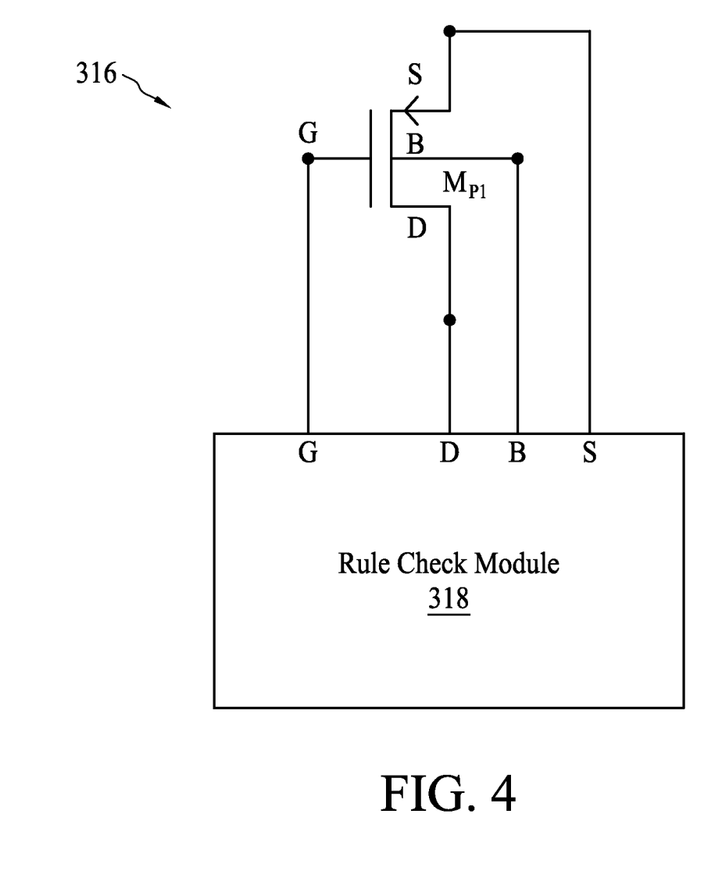
FIG. 4 is a schematic circuit diagram showing both the device and the rule check module in the subcircuit in FIG. 3 in accordance with some embodiments.

The netlist 312 in operation 110 includes the subcircuit 316. FIG. 4 is a schematic circuit diagram showing both the device and the rule check module in the subcircuit 316 in FIG. 3 in accordance with some embodiments. The subcircuit 316 includes the p-channel power MOSFET $M_{p1}$ and the rule check module 318. In parallel to the drain terminal D, the gate terminal G, the source terminal S and a body terminal B of the p-channel power MOSFET $M_{p1}$, the rule check module 318 has terminals D, G, S and B. The terminals D, G, S and B of the rule check module 318 are correspondingly coupled to the terminals D, G, S and B of the p-channel power MOSFET $M_{p1}$. By connecting the terminals D, G, S and B of the p-channel power MOSFET $M_{p1}$ to the terminals D, G, S and B of the rule check module 318, respectively, and specifying the rule check model parameters shown in the list of parameters 214 in FIG. 2 in association with the rule check module 318, the terminals D, G, S and B of the p-channel power MOSFET $M_{p1}$ are subject to the SOA. The SOA has a non-rectangular boundary controlled by the rule check model parameters. For example, the gate to source voltage $V_{GS}$ across the terminals G and S of the p-channel power MOSFET $M_{p1}$ and the drain to source voltage $V_{DS}$ across the terminals D and S of the p-channel power MOSFET $M_{p1}$ are subject to the SOA 654 or 656 to be described with respect to FIGS. 6A and 6B.

In the present disclosure, the gate to source voltage $V_{GS}$ and the drain to source voltage $V_{DS}$ of the p-channel power MOSFET $M_{p1}$ or other PMOS devices should be absolute values. For simplicity, taking the absolute values of the voltages $V_{GS}$ and $V_{DS}$ is omitted to be described at each occurrence of the voltages $V_{GS}$ and $V_{DS}$ in the present disclosure.

Figure 5:
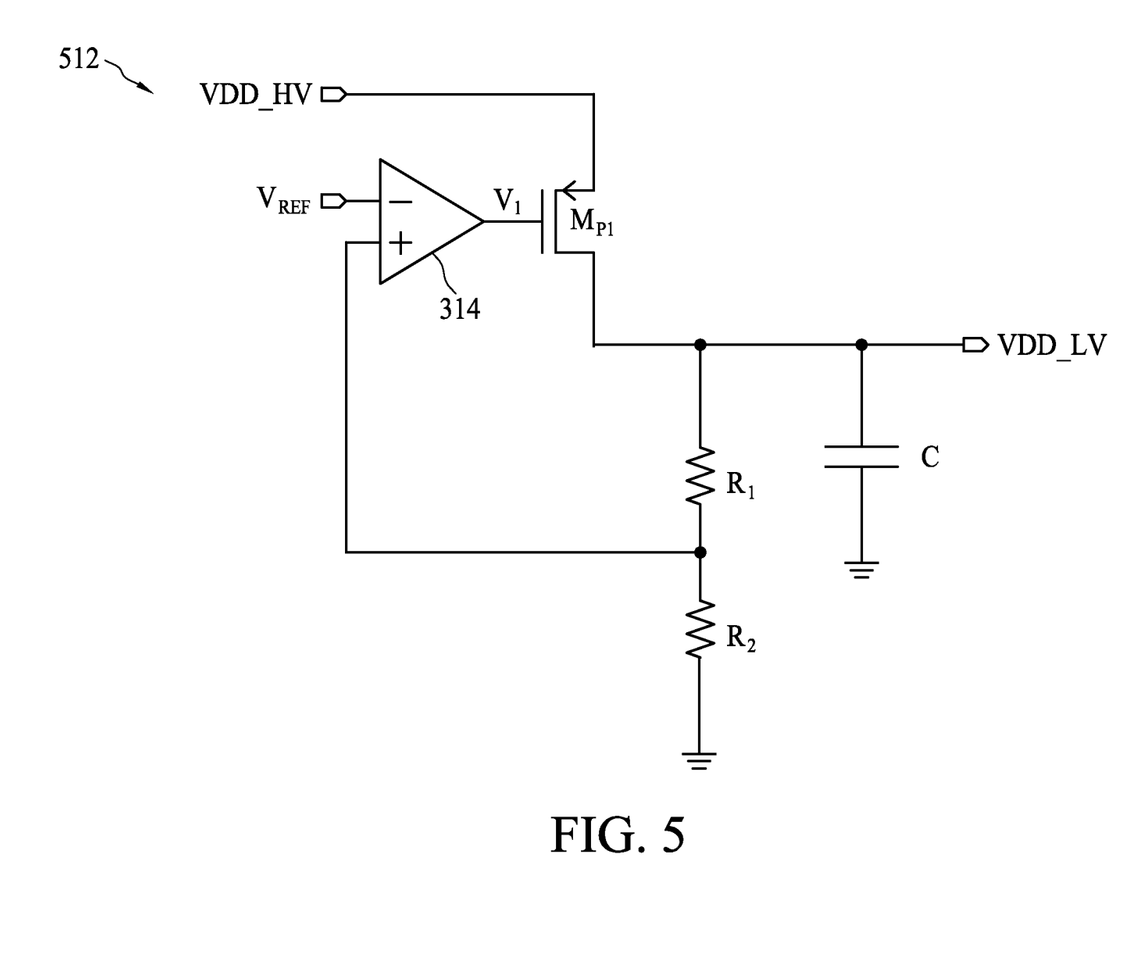
FIG. 5 is a schematic circuit diagram of the netlist annotated with simulation data in accordance with some embodiments.

Referring to FIGS. 1 and 2, in operation 130, the circuit simulator 232 performs simulation on the netlist 212 to obtain simulation data associated with the terminals of the device. As described with reference to FIG. 2, the circuit simulator 232 formulates the system of equations by applying, for example, MNA to the netlist 312 shown in FIG. 3, evaluates a model equation of a device model of the p-channel power MOSFET $M_{p1}$, applies the evaluated result to the system of equations and solves the system of equations to obtain simulation data at nodes of the netlist 312. FIG. 5 is a schematic circuit diagram of the netlist 512 annotated with the simulation data in accordance with some embodiments. In the example shown in FIG. 5, the voltage VDD_HV and the voltage $V_{REF}$ are given to the circuit simulator, and the simulation data $V_1$ and VDD_LV at the gate terminal and drain terminal of the p-channel power MOSFET $M_{p1}$, respectively, are generated from the simulation.

Figure 6A:
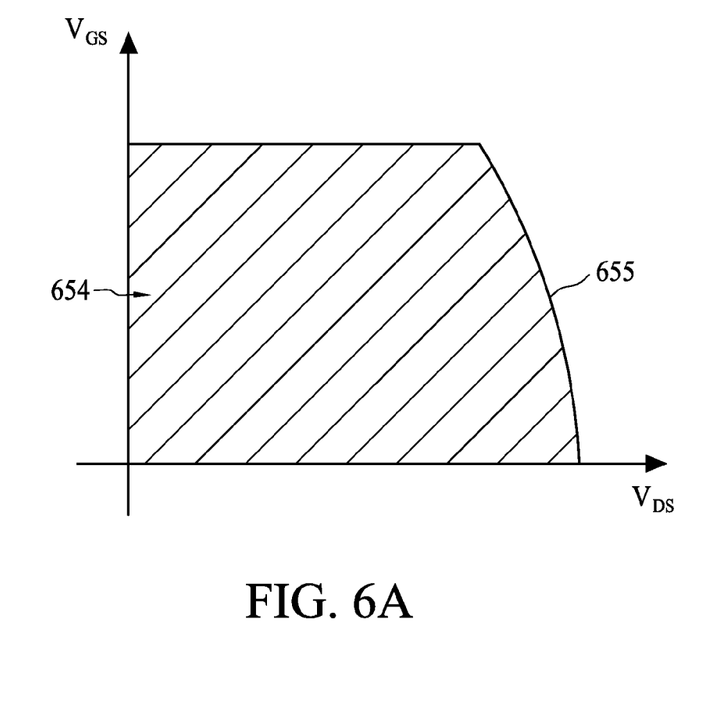
FIG. 6A is a schematic diagram of an SOA formed by the rule check model extension using parameters in association with the rule check module in FIG. 4 in accordance with some embodiments.

Referring to FIGS. 1 and 2, in operation 150, the circuit simulator 232 causes the rule check model extension 272 to form the operating space that has the non-rectangular boundary using the rule check model parameters shown in the list of parameters 214. FIG. 6A is a schematic diagram of the SOA 654 formed by the rule check model extension 272 using the parameters in association with the rule check module 318 in FIG. 4 in accordance with some embodiments. As described with reference to FIG. 4, by coupling the terminals D, G, S, B of the p-channel power MOSFET $M_{p1}$ to the terminals D, G, S, B of the rule check module 318, respectively, the gate to source voltage $V_{GS}$ and the drain to source voltage $V_{DS}$ of the p-channel power MOSFET $M_{p1}$ can be monitored. Further, by specifying the rule check model parameters $a_4, b_4, \ldots$ (shown in FIG. 2) in association with the rule check module 318, the rule check model extension 272 forms the equation $y_4 = f_4(a_4, b_4, \ldots, x_4)$ that defines the segment 655 of the non-rectangular boundary of the SOA 654, and forms the inequality $y_4 < f_4(a_4, b_4, \ldots, x_4)$ using the equation $y_4 = f_4(a_4, b_4, \ldots, x_4)$. In the embodiments in FIG. 6A, the segment 655 of the boundary of the SOA 654 is not a vertical line or horizontal line, and is non-linear. Therefore, at the segment 655 of the boundary of the SOA 654, the voltage $V_{GS}$ has a non-linear dependency on the voltage $V_{DS}$.

Figure 6B:
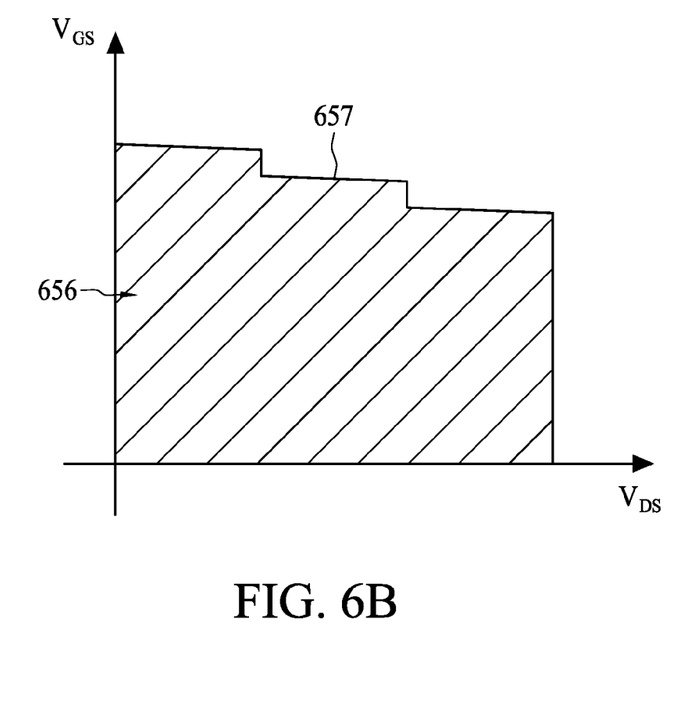
FIG. 6B is a schematic diagram of an SOA formed by the rule check model extension using parameters in association with the rule check module in FIG. 4 in accordance with other embodiments.

FIG. 6B is a schematic diagram of the SOA 656 formed by the rule check model extension 272 using the parameters in association with the rule check module 318 in FIG. 4 in accordance with other embodiments. Compared to the SOA 654 in FIG. 6A, the SOA 656 in FIG. 6B has a non-rectangular boundary that has a staircase-shaped segment 657. Therefore, the limit of the voltage $V_{GS}$ has a dependency on the range of the voltage $V_{DS}$.

Referring to FIGS. 1 and 2, in operation 170, the rule check model extension 272 checks the simulation data against the operating space. The rule check model extension 272 obtains the voltage $V_{GS1}$ and the voltage $V_{DS1}$ of the p-channel power MOSFET $M_{p1}$ (shown in FIG. 5) using the simulation data $V_1$ and VDD_LV generated in the operation 130. The rule check model extension 272 further checks whether the voltage $V_{GS1}$ and the voltage $V_{DS1}$ satisfy the inequalities formed in the operation 150. In other words, the rule check model extension 272 checks whether the coordinate $(V_{DS1}, V_{GS1})$ falls within, for example, the SOA 654 in FIG. 6A.

Figure 7:
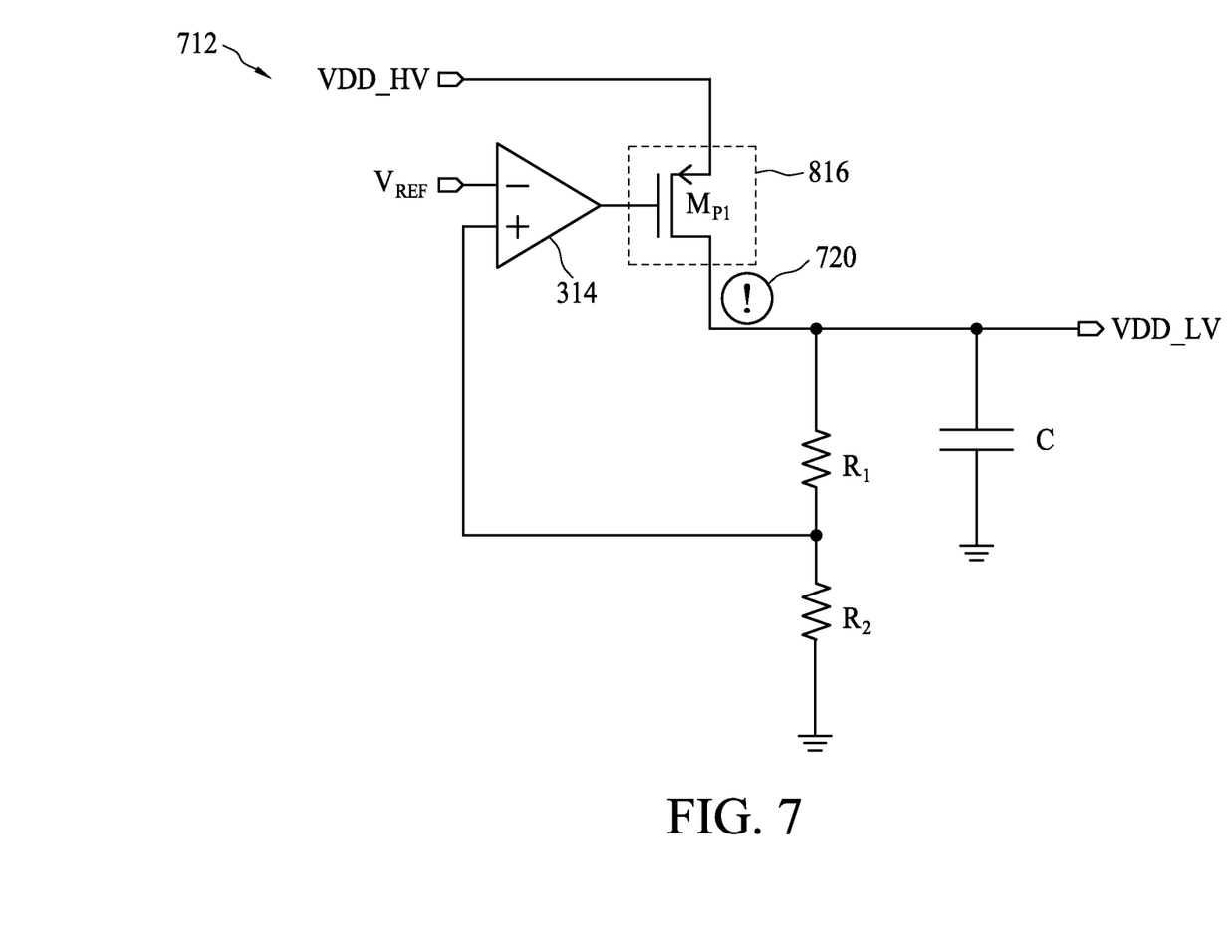
FIG. 7 is a schematic circuit diagram of the netlist in which a warning reflecting that the simulation data does not render the device operating in the SOA is indicated in accordance with some embodiments.

Referring to FIGS. 1 and 2, in operation 190, a situation in which the checked simulation data does not fall within the operating space is reflected. In some embodiments, a warning or error issued by the rule check model extension 272 is sent to the circuit simulator 232 and reflected in the simulation result 292. FIG. 7 is a schematic circuit diagram of the netlist 712 in which a warning 720 reflecting that the simulation data does not render the device $M_{p1}$ operating in the SOA is indicated in accordance with some embodiments. For example, suppose the rule check model extension 272 finds that the voltage $V_{GS1}$ and the voltage $V_{DS1}$ of the p-channel power MOSFET $M_{p1}$ obtained from the provided input voltage VDD_HV and the simulation data $V_1$ and VDD_LV do not render the p-channel power MOSFET $M_{p1}$ operate within the SOA 654 in FIG. 6A. The rule check model extension 272 issues a warning to the circuit simulator 232. When the circuit simulator 232 generates the simulation result 292 which is represented graphically by the netlist 712 in FIG. 7, the warning 720 is displayed at the corresponding node in the netlist 712 that results in the warning 720. Although the warning 720 is displayed graphically in FIG. 7, text-based warnings and errors are within the contemplated scope of the present disclosure.

Figure 8:
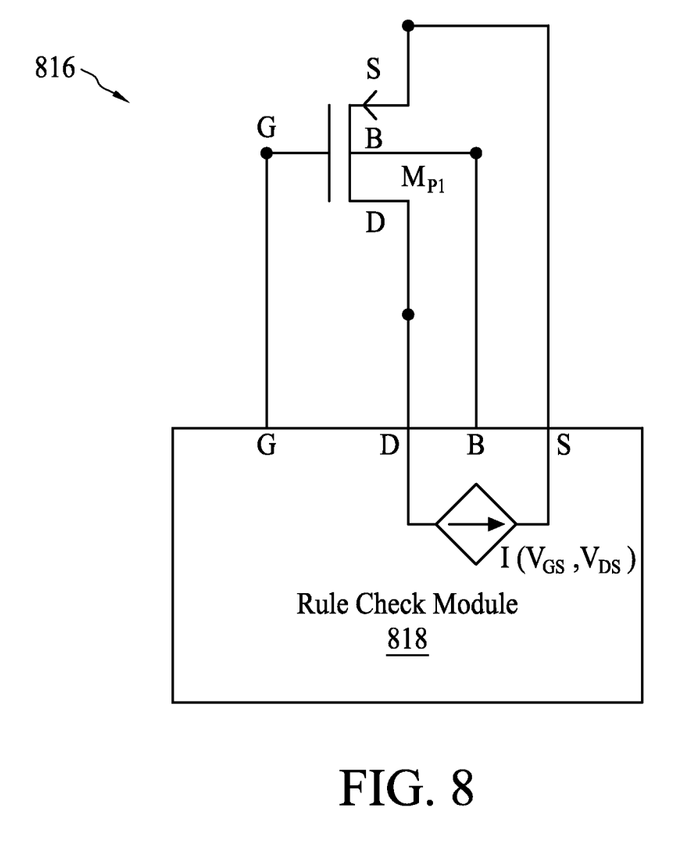
FIG. 8 is a schematic circuit diagram of the subcircuit that has an imposed current source to emulate the behavior of the destructed device when the checked simulation data does not fall within the SOA in FIG. 6A in accordance with some embodiments.

In some embodiments, in order to reflect the situation in which the checked simulation data do no fall within the operating space of the device, an element coupled to the relevant terminals of the device to emulate a behavior of the destructed device is imposed. FIG. 8 is a schematic circuit diagram of the subcircuit 816 that has an imposed voltage controlled current source $I(V_{GS}, V_{DS})$ to emulate the behavior of the destructed device $M_{p1}$ when the checked simulation data $(V_{DS1}, V_{GS1})$ does not fall within the SOA 654 in FIG. 6A in accordance with some embodiments. If the drain to source voltage $V_{DS1}$ of the p-channel power MOSFET $M_{p1}$ is too large to be carried by a channel of the device $M_{p1}$, a large current may "punch through" the channel, causing circuit failure and sometimes damaging the device $M_{p1}$ due to excessive heating. Therefore, when the rule check model extension 272 in FIG. 2 finds that the checked simulation data $(V_{DS1}, V_{GS1})$ of the p-channel power MOSFET $M_{p1}$ does not fall within the SOA 654 in FIG. 6A, the rule check model extension 272 imposes the current source $I(V_{GS}, V_{DS})$ coupled between the terminals D and S of the rule check module 818 to emulate the large current that punches through the channel of the p-channel power MOSFET $M_{p1}$. The rule check model extension 272 sends back the modified netlist that includes subcircuit 816 configured with the imposed current source $I(V_{GS}, V_{DS})$ to the circuit simulator 232. The circuit simulator 232 performs further simulation on the modified netlist and generates an abnormal simulation result 292 such as excessively large power consumption that a designer can hardly overlook.

Figure 9:
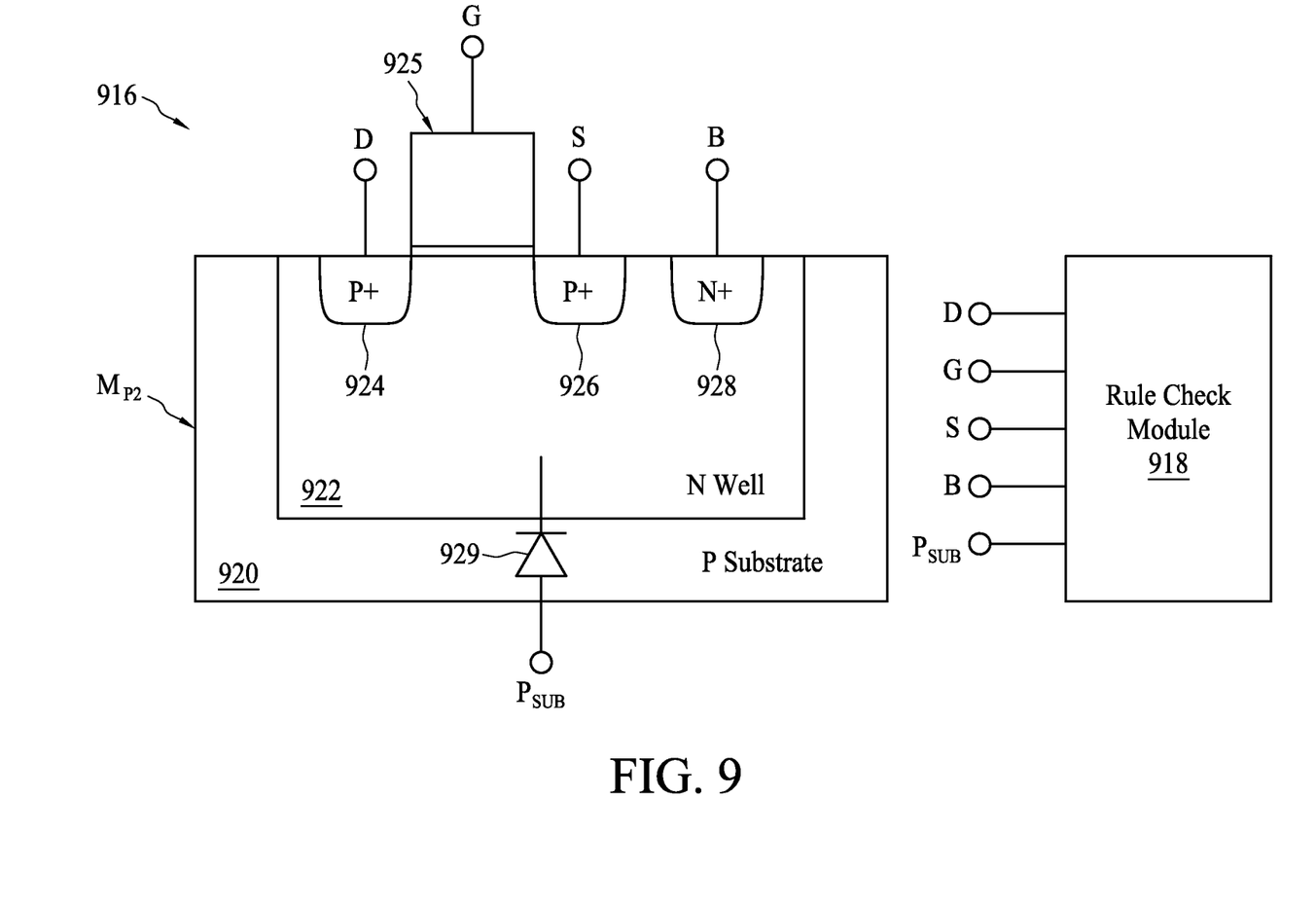
FIG. 9 is a schematic diagram illustrating a subcircuit that includes a multi-terminal device, and a rule check module that has terminals parallel to the multi-terminal device in accordance with some embodiments.

In the embodiments described with reference to FIG. 4, the rule check module 318 has terminals D, G, S and B that are parallel to the terminals D, G, S and B of the device $M_{p1}$. FIG. 9 is a schematic diagram illustrating a subcircuit 916 that includes a multi-terminal device $M_{p2}$, and a rule check module 918 that has terminals parallel to the multi-terminal device $M_{p2}$ in accordance with some embodiments. The subcircuit 916 includes the multi-terminal device $M_{p2}$ and the rule check module 918. The multi-terminal device $M_{p2}$ includes a PMOS of which the device model is intrinsic to the circuit simulator 232 in FIG. 2 and a parasitic diode 929. The PMOS includes a P substrate 920, an N well 922, a gate stack 925, a drain region 924, a source region 926, and a body contact region 928. In some embodiments, the P substrate 920 is a bulk semiconductor substrate such as a bulk silicon substrate, and is doped with p-type dopants such as boron (B). The P substrate 920 is further doped with n-type dopants such as arsenic (As) to form the N well 922 in the P substrate 920. The N well 922 is the body region of the PMOS. The gate stack 925 is formed over the N well 922. The drain region 924 and the source region 926 are formed on opposite sides of the gate stack 925 and are P+ regions formed by further doping the N well 922 with p-type dopants. The body contact region 928 is an N+ region in the N well 922 more heavily doped with n type dopants than the N well 922. The terminals D, G, S, and B of the PMOS are configured at the drain region 924, the gate stack 925, the source region 926 and the body contact region 928 of the PMOS, respectively.

The parasitic diode 929 is formed by the P substrate 920 and the N well 922. The parasitic diode 929 is not modeled in the device model of the PMOS in the circuit simulator 232. However, the integrity of the parasitic diode 929 also affects the integrity of the PMOS. As a result, the multi-terminal device $M_{p2}$ that has the terminals D, G, S and B of the PMOS and an additional terminal $P_{SUB}$ formed by a cathode of the parasitic diode 929 is created. The anode of the parasitic diode 929 is coupled to the terminal B of the PMOS. The rule check module 918 also has terminals D, G, S, B and $P_{SUB}$ that are parallel to the multi-terminal device $M_{p2}$ and are correspondingly coupled to the terminals D, G, S, B and $P_{SUB}$ of the multi-terminal device $M_{p2}$ to monitor if both the PMOS and the parasitic diode 929 operate within the respective SOA and SOR.

Figure 10:
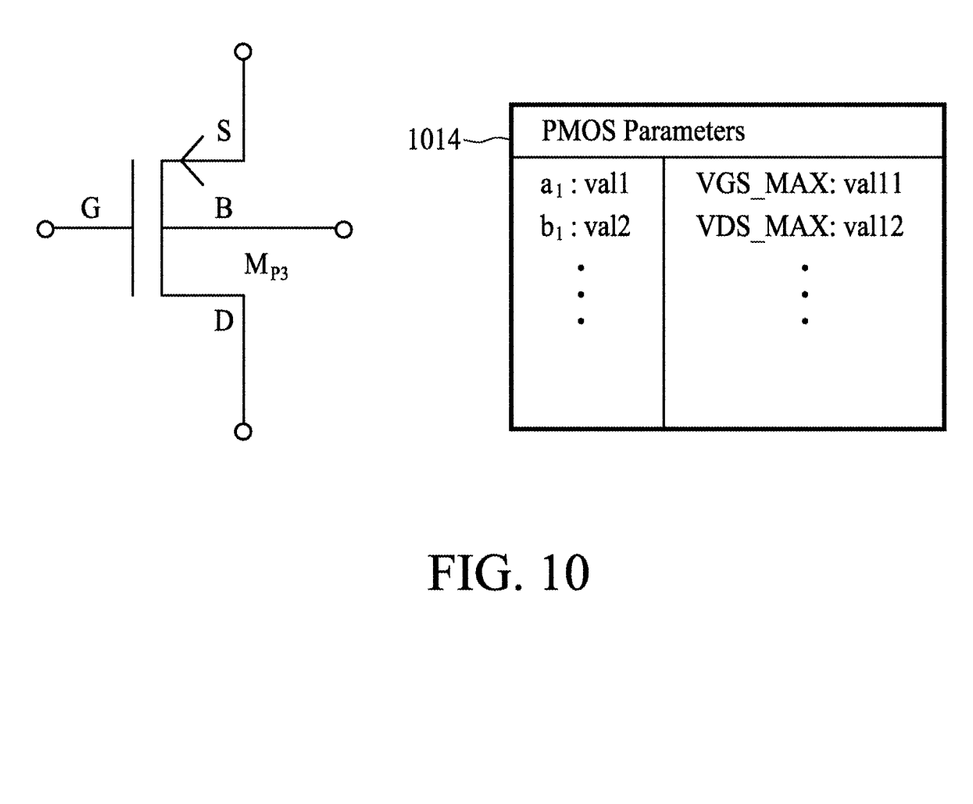
FIG. 10 illustrates a PMOS with model parameters that are intrinsic to the circuit simulator in FIG. 2 and define a rectangular boundary of an SOA of the PMOS.

In comparison to the embodiments described with reference to FIG. 4, FIG. 10 illustrates a PMOS $M_{p3}$ with model parameters VGS_MAX and VDS_MAX that are intrinsic to the circuit simulator 232 in FIG. 2 and define a rectangular boundary of an SOA of the PMOS $M_{p3}$. The PMOS $M_{p3}$ has terminals D, G, S and B, and instead of using the rule check module 318 shown in FIG. 4 to enable checking whether the p-channel power MOSFET $M_{p1}$ operates within the SOA, the SOA of the PMOS $M_{p3}$ is formed using the model parameters VGS_MAX, VDS_MAX . . . of the device model intrinsic to the circuit simulator 232. The values val11 and val12 of the model parameters VGS_MAX, VDS_MAX . . . are provided to the circuit simulator 232 in the list of parameters 1014. The model parameters VGS_MAX and VDS_MAX define limits that the voltages $V_{GS}$ and $V_{DS}$ of the PMOS $M_{p3}$ cannot exceed, respectively. The limit of the voltage $V_{GS}$ have no dependency on the limit of the voltage $V_{GS}$. Therefore, the SOA of the PMOS $M_{p3}$ is rectangular.

Figure 11:
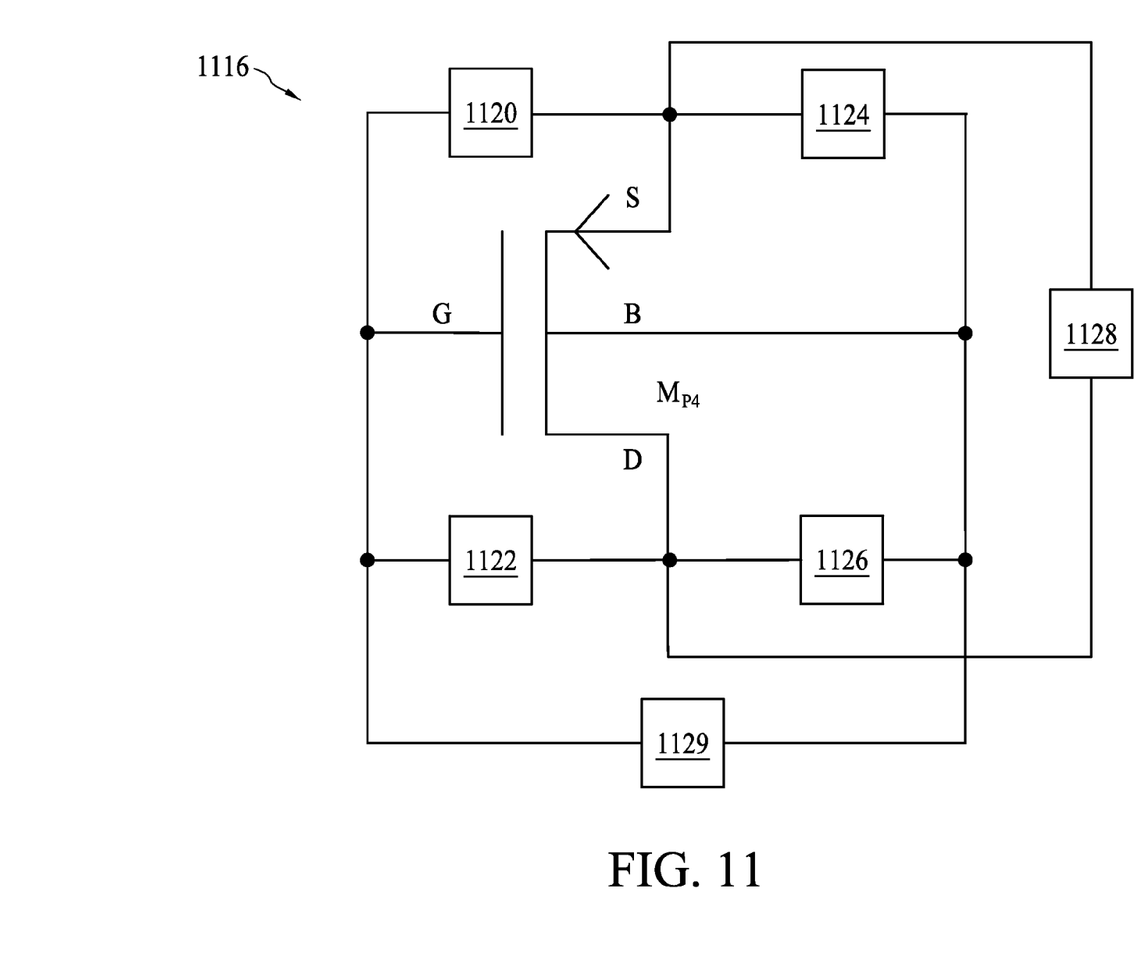
FIG. 11 illustrates a PMOS and primitive elements that are configured between every two terminals of the PMOS, respectively, for performing SOA check.

In comparison to the embodiments described with reference to FIG. 4, FIG. 11 illustrates a PMOS $M_{p4}$ and a primitive element 1120, 1122, 1124, 1126, 1128 and 1129 that are configured between every two terminals of the PMOS $M_{p4}$, respectively, for performing SOA check. The PMOS $M_{p4}$ has terminals D, G, S and B, and instead of using the single rule check module 318 that has the terminals D, G, S, and B parallel to the p-channel power MOSFET $M_{p1}$ in FIG. 4, the primitive elements 1120, 1122, 1124, 1126, 1128 and 1129 are configured between every two terminals G and S, G and D, B and S, B and D, D and S, and G and B of the PMOS $M_{p4}$, respectively. The primitive elements 1120, 1122, 1124, 1126, 1128 and 1129 are elements recognized by the circuit simulator 232 in FIG. 2. For example, the primitive elements 1120 and 1128 are capacitors, and an SOA of voltages $V_{GS}$ and $V_{DS}$ are defined as limits of voltages across the capacitors, respectively. The additionally introduced primitive elements 1120, 1122, 1124, 1126, 1128 and 1129 are not only cumbersome to construct for the designer, but also further complicate the system of equations to be solved by the circuit simulator 232 during simulation and can result in more iterations to reach convergence. Furthermore, the limit of the voltage across the primitive element 1120 has no dependency on the limit of the voltage across the primitive element 1128. Therefore, the SOA of the PMOS $M_{p4}$ is rectangular.

Figure 12:
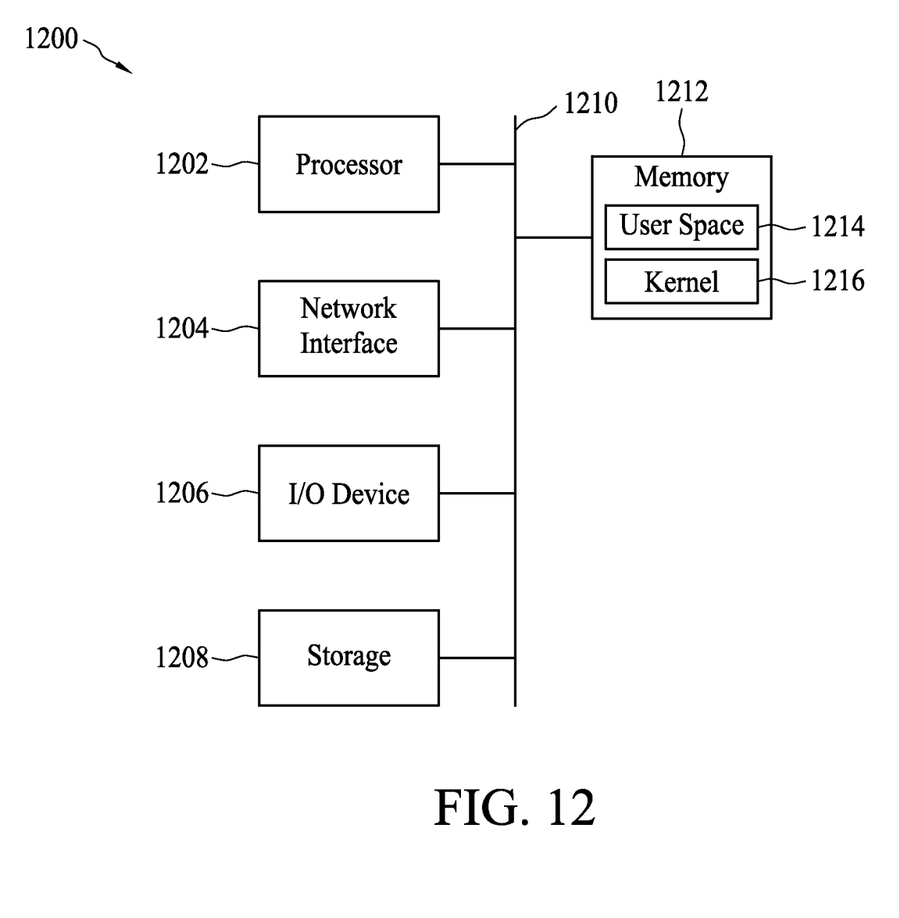
FIG. 12 is a block diagram of a hardware system for implementing the method and software system embodiments described with references to FIGS. 1 to 9 in accordance with some embodiments.

FIG. 12 is a block diagram of a hardware system 1200 for implementing the method and software system embodiments described with references to FIGS. 1 to 9 in accordance with some embodiments. The system 1200 includes at least one processor 1202, a network interface 1204, an input and output (I/O) device 1206, a storage 1208, a memory 1212, and a bus 1210. The bus 1210 couples the network interface 1204, the I/O device 1206, the storage 1208 and the memory 1212 to the processor 1202.

In some embodiments, the memory 1212 comprises a random access memory (RAM) and/or other volatile storage device and/or read only memory (ROM) and/or other non-volatile storage device. The memory 1212 includes a kernel 1216 and user space 1214, configured to store program instructions to be executed by the processor 1202 and data accessed by the program instructions.

In some embodiments, the network interface 1204 is configured to access program instructions and data accessed by the program instructions stored remotely through a network. The I/O device 1206 includes an input device and an output device configured for enabling user interaction with the system 1200. The input device comprises, for example, a keyboard, a mouse, etc. The output device comprises, for example, a display, a printer, etc. The storage device 1208 is configured for storing program instructions and data accessed by the program instructions. The storage device 1208 comprises, for example, a magnetic disk and an optical disk.

In some embodiments, when executing the program instructions, the processor 1202 is configured to perform the method described with reference to FIGS. 1 and 3 to 9, or as the software system described with reference to FIGS. 2 and 3 to 9.

In some embodiments, the program instructions are stored in a non-transitory computer readable recording medium such as one or more optical disks, hard disks and non-volatile memory devices.

Some embodiments have one or a combination of the following features and/or advantages. In some embodiments, during simulation of a netlist, in order to perform rule checking on a device in the netlist, the device is encapsulated in a subcircuit that is configured with a rule check module. The rule check module has terminals that are parallel to and correspondingly coupled to those of the device. By coupling the terminals of the device to those of the rule check module, simulation data at the terminals of the device are checked against a safe operating space of the device. The boundary of the safe operating space of the device is controlled by at least one parameter specified in association with the rule check module. In some embodiments, the formation and checking of the device against the safe operating space are performed by a rule check model extension in communication with a circuit simulator. Because the simulation data at the terminals of the device are provided to the rule check model extension by the circuit simulator, a limit in the simulation data associated with some of the terminals of the device can have dependency on a limit in the simulation data associated with some other terminals of the device. In other words, the boundary of the safe operating space can be non-rectangular. Furthermore, only a single rule check module is introduced to monitor the device instead of additional elements introduced between every two terminals of the device, respectively. Therefore, the circuit simulator can reach convergence to a solution faster. Additionally, when the checked simulation data of the device does not fall within the safe operating space, an element that emulates a behavior of the destructed device can be imposed between the terminals that fail to operate within the safe operating space. In this way, the designer can hardly overlook the situation that the checked simulation data of the device does not fall within the safe operating space.

In some embodiments, in a method performed by at least one processor, a netlist is received by the at least one processor. The netlist comprises a subcircuit that comprises a device and a rule check module. The rule check module specifies a plurality of terminals of the device subject to an operating space, and at least one parameter that controls a non-rectangular boundary of the operating space. The netlist is simulated to obtain simulation data associated with the terminals of the device by the at least one processor. The operating space that has the non-rectangular boundary is formed by using the at least one parameter. The simulation data is checked against the operating space by the at least one processor. A situation in which the checked simulation data does not fall within the operating space is reflected by the at least one processor.

In some embodiments, a system comprises at least one processor, configured to execute program instructions which configure the at least one processor as a circuit simulator and a rule check model extension and at least one memory configured to store the program instructions. The circuit simulator is configured to receive a netlist. The netlist comprises a subcircuit that comprises a device and a rule check module. The rule check module specifies a plurality of terminals of the device subject to an operating space, and at least one parameter that controls a non-rectangular boundary of the operating space. The circuit simulator is further configured to simulate the netlist to obtain simulation data associated with the terminals of the device. The rule check model extension is configured to receive the netlist and form the operating space that has the non-rectangular boundary using the at least one parameter. The rule check model extension is further configured to check the simulation data against the operating space. The rule check model extension is further configured to cause the circuit simulator to reflect a situation in which the checked simulation data does not fall within the non-rectangular boundary of the operating space.

In some embodiments, in a method performed by at least one processor, a netlist is received by the at least one processor. The netlist comprises a subcircuit that comprises a device and a rule check module. The rule check module specifies a plurality of terminals of the device space, and at least one parameter that serves as at least one coefficient of an first equation bounding the operating space. The first equation is not a horizontal line or vertical line equation. The netlist is simulated to obtain simulation data associated with the terminals of the device by the at least one processor. The operating space is formed using the first equation. The simulation data against the operating space is checked by the at least one processor. A situation in which the checked simulation data does not fall within the operating space is reflected by the at least one processor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
    receiving, by the at least one processor, a netlist,
    wherein the netlist comprises a subcircuit that comprises a device and a rule check module;
    the rule check module specifies a plurality of terminals of the device subject to an operating space, and at least one parameter that controls a non-rectangular boundary of the operating space;
    simulating, by the at least one processor, the netlist to obtain simulation data associated with the terminals of the device;
    forming, by the at least one processor, the operating space that has the non-rectangular boundary using the at least one parameter;
    checking, by the at least one processor, the simulation data against the operating space; and
    reflecting, by the at least one processor, a situation in which the checked simulation data does not fall within the operating space.

2. The method of claim 1, wherein the forming, by the at least one processor, the operating space that has the non-rectangular boundary using the at least one parameter comprises:
    forming a plurality of equations representing the non-rectangular boundary, wherein a first equation in the plurality of equations is defined in terms of at least two variables associated with at least three of the terminals of the device, and using the at least one parameter as at least one coefficient of the first equation; and
    forming a plurality inequalities representing the operating space using the plurality of equations.

3. The method of claim 2, wherein the first equation is a non-linear equation.

4. The method of claim 1, wherein the reflecting, by the at least one processor, the situation in which the checked simulation data does not fall within the operating space comprises:
    issuing a warning or error when the checked simulation data associated with the at least three of the terminals of the device does not fall within the non-rectangular boundary of the operating space.

5. The method of claim 4, wherein the reflecting, by the at least one processor, the situation in which the checked simulation data does not fall within the operating space further comprises:
    imposing an element coupled to one of the terminals of the device to emulate a behavior of the destructed device when the checked simulation data associated with the at least three of the terminals of the device does not fall within the non-rectangular boundary of the operating space.

6. The method of claim 1, wherein the rule check module comprises first terminals that are defined and coupled in parallel to the terminals of the device.

7. The method of claim 6, wherein the rule check module further comprises a second terminal; and
    the subcircuit further comprises a parasitic element coupled between one of the terminals of the device and the second terminal of the rule check module.

8. A system, comprising:
  at least one processor, configured to execute program instructions which configure the at least one processor as a circuit simulator and a rule check model extension:
    the circuit simulator is configured to receive a netlist, wherein the netlist comprises a subcircuit that comprises a device and a rule check module,
    the rule check module specifies a plurality of terminals of the device subject to an operating space, and at least one parameter that controls a non-rectangular boundary of the operating space;
    the circuit simulator is further configured to simulate the netlist to obtain simulation data associated with the terminals of the device;
    the rule check model extension is configured to receive the netlist and form the operating space that has the non-rectangular boundary using the at least one parameter;
    the rule check model extension is further configured to check the simulation data against the operating space; and
    the rule check model extension is further configured to cause the circuit simulator to reflect a situation in which the checked simulation data does not fall within the non-rectangular boundary of the operating space; and
  at least one memory configured to store the program instructions.

9. The system of claim 8, wherein the rule check model extension is configured to form the operating space that has the non-rectangular boundary using the at least one parameter by performing operations comprising:
  forming a plurality of equations representing the non-rectangular boundary, wherein a first equation in the plurality of equations is defined in terms of at least two variables associated with at least three of the terminals of the device, and using the at least one parameter as at least one coefficient of the first equation; and
  forming a plurality inequalities representing the operating space using the plurality of equations.

10. The system of claim 9, wherein the first equation is a non-linear equation.

11. The system of claim 8, wherein the rule check model extension causes the circuit simulator to reflect the situation in which the checked simulation data does not fall within the non-rectangular boundary of the operating space by performing operations comprising:
  issuing a warning or error when the checked simulation data associated with the at least three of the terminals of the device does not fall within the non-rectangular boundary of the operating space.

12. The system of claim 11, wherein the rule check model extension causes the circuit simulator to reflect the situation in which the checked simulation data does not fall within the non-rectangular boundary of the operating space by performing the operations further comprising:
  imposing an element coupled to one of the terminals of the device to emulate a behavior of the destructed device when the checked simulation data associated with the at least three of the terminals of the device does not fall within the non-rectangular boundary of the operating space.

13. The system of claim 8, wherein the rule check module comprises first terminals that are defined and coupled in parallel to the terminals of the device.

14. The system of claim 13, wherein the rule check module further comprises a second terminal; and
  the subcircuit further comprises a parasitic element coupled between one of the terminals of the device and the second terminal of the rule check module.

15. A method, performed by at least one processor, comprising:
  receiving, by the at least one processor, a netlist, wherein the netlist comprises a subcircuit that comprises a device and a rule check module;
  the rule check module specifies a plurality of terminals of the device space, and at least one parameter that serves as at least one coefficient of an first equation bounding the operating space,
  wherein the first equation is not a horizontal line or vertical line equation;
  simulating, by the at least one processor, the netlist to obtain simulation data associated with the terminals of the device;
  forming, by the at least one processor, the operating space using the first equation;
  checking, by the at least one processor, the simulation data against the operating space; and
  reflecting, by the at least one processor, a situation in which the checked simulation data does not fall within the operating space.

16. The method of claim 15, wherein the first equation is a non-linear equation.

17. The method of claim 15, wherein the reflecting, by the at least one processor, the situation in which the checked simulation data does not fall within the operating space comprises:
  issuing a warning or error when the checked simulation data associated with the at least three of the terminals of the device does not fall within the operating space.

18. The method of claim 17, wherein the reflecting, by the at least one processor, the situation in which the checked simulation data does not fall within the operating space further comprises:
  imposing an element coupled to one of the terminals of the device to emulate a behavior of the destructed device when the checked simulation data associated with the at least three of the terminals of the device does not fall within the operating space.

19. The method of claim 15, wherein the rule check module comprises first terminals that are defined and coupled in parallel to the terminals of the device.

20. The method of claim 19, wherein the rule check module further comprises a second terminal; and
  the subcircuit further comprises a parasitic element coupled between one of the terminals of the device and the second terminal of the rule check module.

* * * * *